United States Patent [19]

Nakashima et al.

[11] Patent Number: 5,364,248
[45] Date of Patent: Nov. 15, 1994

[54] SLIDING MEMBER, A METHOD FOR PRODUCING SAME, AND USAGES OF SAME

[75] Inventors: Shoichi Nakashima, Hitachi; Yukiko Fukaya, Tokyo; Katsuhiro Komuro, Hitachi; Tadashi Iizuka, Ashikaga, all of Japan

[73] Assignee: Hitachi, Ltd., Tokyo, Japan

[21] Appl. No.: 36,021

[22] Filed: Mar. 23, 1993

[30] Foreign Application Priority Data

Mar. 23, 1992 [JP] Japan .................................. 4-64740

[51] Int. Cl.$^5$ .................................. F01C 21/02
[52] U.S. Cl. .................................. 418/178; 418/179; 384/912; 384/286; 427/523; 427/533; 427/249; 427/255.3; 29/898.1; 29/898.12; 29/898.13; 428/469; 428/472.2; 428/698; 428/701
[58] Field of Search .................. 418/55.2, 178, 179; 384/912, 286; 428/627, 632, 633, 469, 472.2, 698, 701, 702, 148; 427/585, 533, 249, 255.3, 523; 29/898.1, 898.12, 898.13

[56] References Cited

U.S. PATENT DOCUMENTS

| 4,503,119 | 3/1985 | Shirahata et al. | 428/336 |
| 4,904,362 | 2/1990 | Gaertner et al. | 204/298 |
| 5,045,495 | 9/1991 | Koroschetz et al. | 428/612 |
| 5,064,682 | 11/1991 | Kiyama et al. | 427/585 |
| 5,165,870 | 11/1992 | Sato | 418/178 |

FOREIGN PATENT DOCUMENTS

| 0418905A3 | 9/1990 | European Pat. Off. . |
| 3931565 | 1/1991 | Germany . |
| 1063692 | 3/1989 | Japan . |
| 3090571 | 4/1991 | Japan . |
| 8901094 | 2/1989 | WIPO . |

OTHER PUBLICATIONS

Thin Solid Films, vol. 171, No. 2, Apr. 15, 1989, Lausanne CH., pp. 263-270, Takano et al., "Preparation of TiN Thin Films by Using an $N_2+$ Ion Beam of 1keV".

*Primary Examiner*—Richard A. Bertsch
*Assistant Examiner*—Charles G. Freay
*Attorney, Agent, or Firm*—Antonelli, Terry, Stout & Kraus

[57] ABSTRACT

The object of the present invention is to provide sliding members having preferable lubrication and seizure resistance. Sliding members comprising a columnar texture which is composed from at least one of metal nitrides, metal oxides, metal carbides, and metals on a base member, wherein the columnar texture is composed of assemblies of fine columnar asperities, with intervals formed between the columnar asperities being connected to each other so as to form a net work, and with gaseous, liquid, or solid lubricants being maintained in the intervals. The mutually connected intervals in the columnar texture are superior in filling and holding of lubricants, and the above described superiorities improve lubrication and seizure resistance and extend sliding life.

13 Claims, 4 Drawing Sheets

SLIDING MEMBER, A METHOD FOR PRODUCING SAME, AND USAGES OF SAME

BACKGROUND OF THE INVENTION (1) Field of the Invention

The present invention relates to a sliding member, especially, to the wear resistant sliding member processed with a surface treatment.

(2) Description of the Prior Art

In order to enhance wear resistivity of sliding members of machines, improvement of the sliding members themselves and surface reforming of sliding portions etc. are performed.

As for the surface reforming of sliding portions, methods for forming a hard coating on the surface of the sliding members by such methods as hard chromium plating, ceramic coatings, and hard anodic oxidation coatings etc. are well known. Recently, forming metallic coatings having a low melting point or organic polymer coatings on the sliding surface are adopted in order to give a lubricating property in addition to wear resistant property.

When hard coating is formed on the surface of the sliding members, wettability with lubricating oil or the holding property of the lubricating oil become problems. As for the reforming coating having a preferable holding property of the lubricating oil, the hard anodic oxidation coatings can be exemplified. Alumite layer formed by anodic oxidation on an aluminum alloy has a great number of fine vertical holes, and has a preferable holding property of lubricating oil because of impregnation of the lubricating oil into the vertical holes. However, if the diameter of the vertical hole is too small and viscosity of the lubricating oil is too high, the holding property of the lubricating oil is decreased. Accordingly, it is important to control the diameter of the fine vertical hole so as to obtain a proper size of the holes matched to the viscosity of the lubricating oil.

In order to make the wear resistant property compatible with the lubricating property, there is a method for forming a surface layer with organic material or soft metal having a preferable lubricating property, wherein hard particles are dispersed. However, the above described material has such a problem that the hard particles are separated from the matrix layer in accordance with the proceeding of abrasion and cause abrasive wear by entering into frictional planes. Accordingly, it is important to prevent separation of the hard particles from the matrix layer.

As for a rotary drum for videotape recorder composed of sliding members made from an aluminum-silicon alloy, a sliding member, which is improved in sliding characteristics by forming and projecting fine silicon crystalline particles having a particle size smaller than a submicron on a surface layer of the sliding portion of the drum whereon the tape slides, is proposed (JP-A-57-147155 (1982)). In this case, the hard silicon particles which are dispersedly formed at the surface of the aluminum sliding material enhance a gas (air) lubricating effect by projecting out from the surface of the aluminum matrix, but, on the other hand, there is such a problem that failure of the friction planes is easily caused by separation of the hard silicon particles.

One of the methods to solve such a problem is, for example, a method to form a porous surface structure by vacuum vapour deposition of zirconia at an elevated temperature higher than 500° C. However, almost all of the many pores formed by the above described method are independent pores and are not connected with each other. Additionally, as a process to treat the sliding member at high temperature is indispensable for forming the porous surface in the above described method, the method is not applicable to such members as a member which has previously been processed by heat treatment (quenching or annealing), a member which will cause distortion by heating or cooling, or a member composed from metal having a low melting point.

SUMMARY OF THE INVENTION

OBJECTS OF THE INVENTION

One of the objects of the present invention is to provide sliding members having preferable wear resistivity and lubricating characteristics.

One of other objects of the present invention is to provide a method for manufacturing the above described sliding members.

Furthermore, another object of the present invention is to provide a compressor for a freezer and/or an air conditioner etc. using the above described sliding members having preferable wear resistivity and lubricating characteristics.

METHODS SOLVING THE PROBLEMS

In order to solve the above described problems, the inventors studied on structures of sliding surfaces and lubricating characteristics thereof, and invented a sliding member having a structure which facilitates impregnation of lubricating liquid or solid into the sliding member and preferable retainment thereof, and preferable wear resistivity itself. The gist of the present invention is as follows:

(i) A sliding member wherein a base member has a columnar texture composed from at least one of metal nitrides, metal oxides, metal carbides, and metals at least on the surface of sliding portion, the columnar texture is composed of assemblies of fine columnar asperities, intervals among the columnar asperities are composed so as to form a mesh structure by mutual combination, and a gas/air or a lubricating agent is retained in the intervals.

A projected area of the interval mesh structure at the surface of the columnar texture is preferably 10–40% of the total surface area of the columnar texture. And, depth of the intervals in the mesh structure is preferably 0.1–5 $\mu$m.

An average diameter of the columnar asperities assembly composing the columnar texture is preferably 0.1–3 $\mu$m. Especially, 0.1–0.5 $\mu$m is preferable.

Besides, forming a substrate composed from at least one of metal nitrides, metal oxides, metal carbides, and metals between the columnar texture and the base member is preferable.

(ii) A method for manufacturing sliding members by irradiating an inactive gas ion beam to at least a surface of the sliding portion of the base member with simultaneous deposition of metals or metallic compounds on the base member by vapour deposition method so as to form a columnar texture comprising assemblies of fine columnar asperities of metals or metallic compounds.

(iii) A method for manufacturing sliding members by irradiating directive inactive gas ion beam and injecting an ion beam of oxygen, nitrogen, or carbon with simultaneous deposition of metals or metallic compounds on the base member by vapour deposition method so as to form a columnar texture comprising assemblies of fine columnar asperities.

As for the above described inactive gas ion beam, ion beams such as argon, xenon, or krypton gas ion beams are used. It is important that the inactive gas ion beam must be a directive gas ion beam. Because, only with the directive inactive gas ion beam, can a columnar texture comprising assemblies of fine columnar asperities, which is one of the features of the present invention, be formed.

A schematic perspective view of the columnar asperities related to the present invention is shown in FIG. 1. Formed on the surface of a sliding portion of the base member 2 the columnar texture 5 composed of columnar asperities 1 which are formed from at least one of the metal nitrides, the metal oxides, the metal carbides, and the metals. Among the asperities, the intervals 3 are formed, and the intervals are mutually connected so as to form a network. A lubricating agent retained among the intervals 3 will lubricate at sliding. Besides, it is preferable that the substrate 4 is formed between the base member 2 and the columnar texture 5.

As for a method for obtaining the columnar texture related to the present invention, the physical vapour deposition method is adequate, especially, the physical vapour deposition method with concurrent ion beam irradiation. Adopting a vapour deposition method or an ion beam spattering method as the physical vapour deposition method, an argon ion beam, a krypton ion beam, or a xenon ion beam is concurrently irradiated during the physical vapour deposition.

The diameter of the columnar asperities and intervals among the columnar asperities composing the columnar texture can be controlled by simultaneous injection of oxygen ions, nitrogen ions, or carbon ions. For instance, in order to enhance the spattering effect at the surface layer where the columnar texture is formed and to control the diameter and the width of the intervals of the columnar asperities in a case of concurrent irradiation with the argon ion beam, the ion energy of 500 eV–200 keV is preferable. In accordance with the above described concurrent irradiation of an ion beam with the physical deposition method, the columnar texture related to the present invention can be obtained by treating the sliding member at room temperature or a lower temperature than the temperature of heat treatment of the sliding member, and, as the columnar texture has a preferable adhesiveness, the method can be applicable to aluminum alloys.

Referring to FIG. 2, an example of manufacturing apparatus for the sliding members relating to the present invention is shown. The sliding member 12 whereon the columnar texture must be formed is set in the vacuum tank 10 of which vacuum is maintained by operation of the vacuum apparatus 11, depositing the metal or the metallic compound 14 on the sliding member by operating the vapour deposition apparatus 13 which is installed in the vacuum tank 10, and concurrently, irradiating or implanting the sliding member with ions by using the ion source 15. The raw material for the directive ion beam 19 projected from the ion source 15 is supplied as the inactive gas 17 or the inactive gas 17 mixed with an adequate amount of reactive gas such as nitrogen, oxygen, or carbon etc. by the mixer 16. The sliding member 12 is held in a temperature controllable holder (not shown in the drawing) furnished with a cooling mechanism and a heater.

A control range of temperature can be arbitrarily determined depending on required temperature for the basic plate, and as for basic plates made from aluminum alloys or resin which require low temperature, the temperature can be arbitrarily controlled between room temperature and 300° C. Preferable temperature for the above described process is around 100° C. Farther, the holder has a mechanism for arbitrarily changing the angle of the deposition plane, the irradiation plane and the implantation plane in accordance with the shape of the sliding member 12. The gas mixer 16 can set predetermined introducing amounts of the inactive gas 17 and the other gases 18, and can mix them together. Besides, vacuum in the vacuum tank 10 is preferably at most 0.005 Torr.

As for the materials of the above described sliding members, in addition to such metals as aluminum group alloys, carbon steels, stainless steels, nickel base alloys, and copper alloys, a sintered ceramic body can be used. Especially, as for the aluminum group alloy, the alloy can include Si in an amount of 1–45% by weight, IIIa group elements in an amount of 0.1–20% by weight, at least one of IVa group elements and Va group elements in an amount of 0.1–5% by weight, and the balance is substantially aluminum, can be used. Especially, Si in amount of 13–35% is preferable.

As for the IIIa group elements, Sc, Y, lanthanide series elements (La, Ce etc.), especially, misch metal are preferable, and an amount of 0.5–5% is preferable. As for the IVa group elements, Ti, Zr, and Hf in amount of 0.5–3% are preferable. Especially, a sintered alloy is preferable when Si is contained in amount of 18–30%.

In accordance with the present invention, as for concurrently usable lubricants, liquid lubricants, solid lubricants, or a mixture of the liquid and the solid lubricants can be adopted depending on intended use of the sliding members. As for the liquid lubricants, conventional mineral oil group lubricating oils, and synthetic lubricating oils (for example, silicone oils), etc. can be enumerated. And as for the solid lubricants, molybdenum disulfide, low melting point metals, or organic polymers (for example, polytetrafluoroethylene), etc. can be enumerated. The above described lubricants can be used in forms of powder, paste, solution, and suspended liquid.

In the columnar texture related to the present invention, assemblies of the columnar asperities are formed by crystal growth of hard materials, and intervals among the mutual columnar asperities are connected like a network. Owing to the fact that the intervals differ from simple vertical pores and are connected with each other, and gas bubbles in the intervals are easily squeezed out by impregnation with the above described lubricant and the intervals are filled with enough amount of the above described lubricant, preferable impregnating and retaining character for the lubricants are realized.

Farther, in case of lubricating the sliding portion with a gas such as a magnetic recording medium etc., the intervals have an effect to stabilize a laminar flow of the gas on the sliding plane.

The width of the intervals among the columnar asperities is optimized depending on viscosity, wettability, and combining strength etc. of the lubricant to be filled. For example, when viscosity of the lubricant is low, the width must be small in order to prevent flowing out of the lubricant. On the contrary, when the viscosity is high, the width must be large in order to retain a large amount of the lubricant.

The columnar asperity may be either a single crystalline growing body or a polycrystalline growing body. However, it is necessary that the area occupied by the columnar asperities group at surface of the columnar texture be sufficient for supporting a bearing pressure added to the sliding portion.

DETAILED DESCRIPTION OF THE EMBODIMENTS (Embodiment 1)

Figure 1:
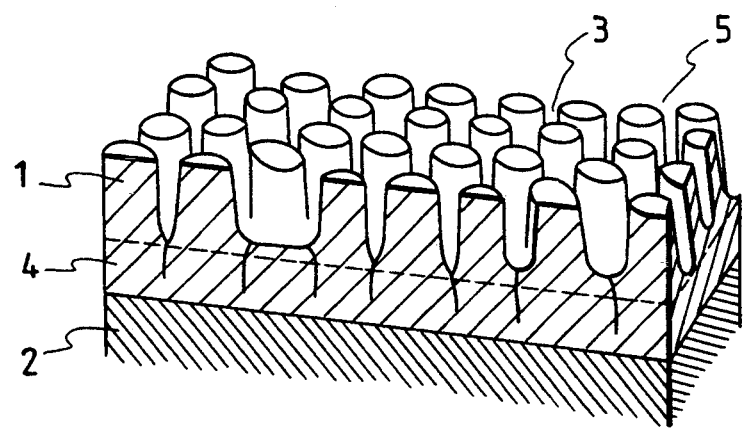
FIG. 1 is a schematic perspective view of the columnar texture on a surface of a sliding member relating to the present invention.
Figure 2:
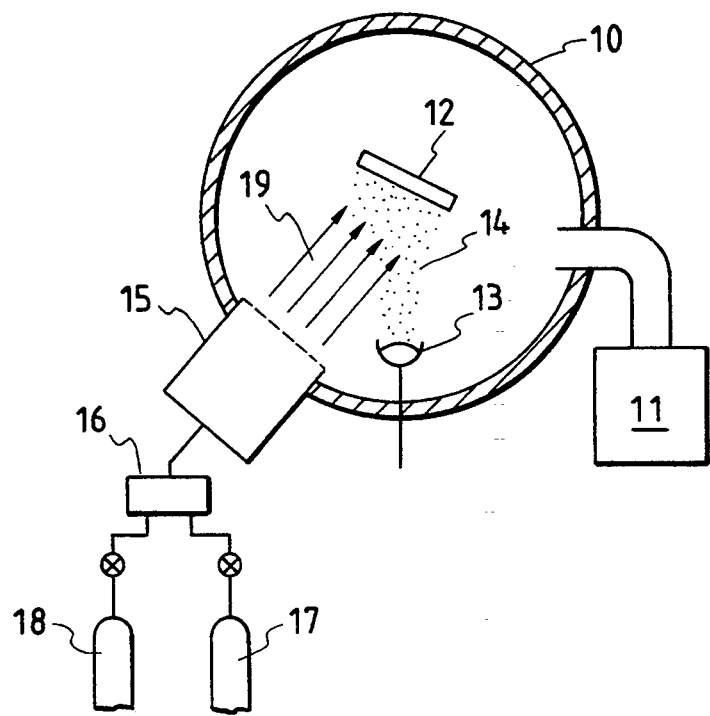
FIG. 2 is a schematic illustration of a manufacturing apparatus relating to the present invention.

A sliding member having the columnar texture as shown in FIG. 1 was prepared by using the apparatus shown in FIG. 2. As for the base member 2, a plate made from an aluminum alloy (Si: 25%, Cu: 3.6%, Mg: 0.7%, Fe: 0.2%, Fe: 0.5%, Zr:0.9%, Ce:2.0%, respectively by weight, and Al: Balance) having dimensions of 50 mm×50 mm×3 mm thick was used. A layer of titanium nitride of about 1 $\mu$m thick was formed as the substrate 4 by irradiating the surface of the base member 2 with nitrogen ions having energy of 10 keV with concurrent deposition of titanium onto the surface of the base member 2 in vacuum (0.005 Torr.). Subsequently, the columnar texture 5 was formed by growing the columnar asperities 1 to about 3 $\mu$m by irradiating the titanium layer with mixed ions including 90–40% nitrogen ions and 10–60% argon ions having energy of 20 keV with concurrent deposition of titanium in an increasing speed of thickness, 0.5 nm/second.

Figure 3:
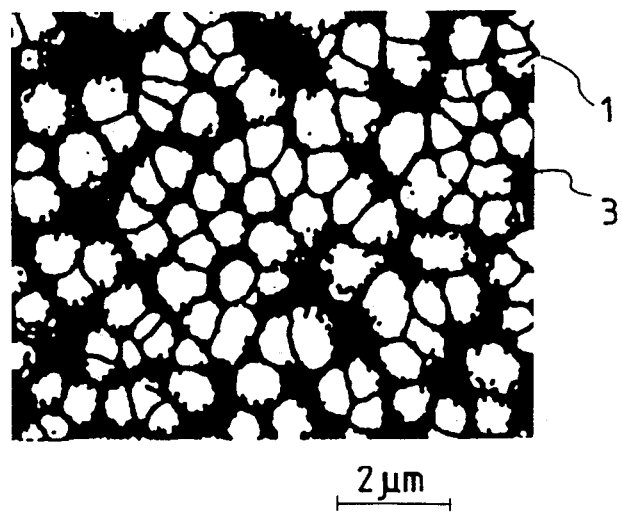
FIG. 3 is an illustration of a scanning electron microscopic photograph of the sliding member surface in the embodiment 1.
Figure 4:
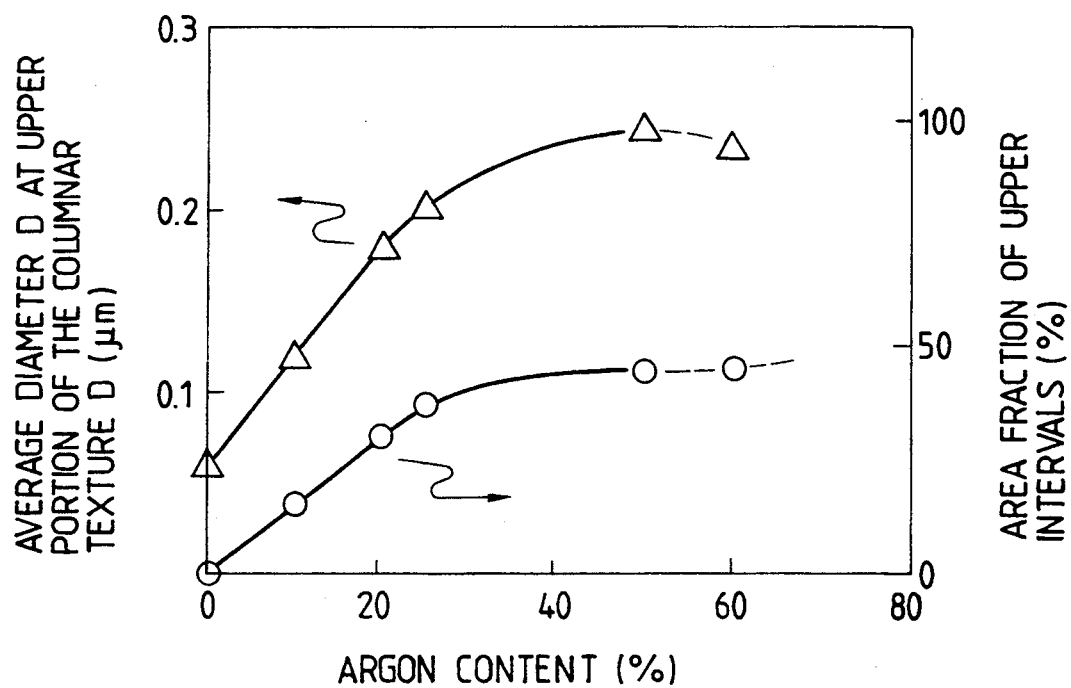
FIG. 4 is a graph indicating a relationship between average diameters of columnar asperities and occupied area fraction of intervals at the surface of the columnar texture versus argon content in irradiating ions.

Referring to FIG. 3, a photograph of a surface of the sliding member relating to the present embodiment taken by an scanning electron microscope is shown. FIG. 4 is a graph indicating a relationship of the average diameter of the columnar asperities at the total surface of the columnar texture and the occupied fraction of the projected intervals area, which were measured by an image treatment of the photograph observed by the scanning electron microscope, versus the argon content in the irradiating ions.

In FIG. 4, a tendency that the occupied area fraction of the intervals increases in accordance with the increment of the argon content can be observed. However, when the argon content exceeded 50 %, an amount of spattering by the ions irradiation increased, and a growing speed of the columnar grains vertical to the surface of the base member were extremely decreased and the aimed columnar texture could not be obtained. Almost the same tendency was observed when krypton or xenon was used for the irradiating inactive gas ion beam. That means, any ion beams having a large spattering effect can be used as a substitute for the argon ion beam.

The aluminum plates whereon the columnar texture were formed were evaluated by reciprocative linear motion sliding tests. An aluminum alloy (Si content: 11%) of which one end was fabricated in a spherical shape having a diameter of 10 mm was selected as a counterpart, and was reciprocated at an interval of 10 mm on a testing sample at a speed of 10 mm/sec with a load of 100 g. Before testing, the testing sample and the counterpart were degreased with acetone, 0.1 milliliter of spindle oil was dropped onto the sliding portion of the testing sample which was horizontally held, the testing sample was moved from the horizontal position to a vertical position after elapsing one minute since the dropping of the spindle oil. The oil which flowed down and gathered at the lower end of the testing sample was wiped off ten minutes after the movement. Friction coefficients were measured without additional supply of the oil after starting of the measurement. Results of the above described testing are shown in Table 1.

TABLE 1

| Testing sample name | Average diameter of columnar asperities ($\mu$m) | Area fraction of intervals (%) | Lubricating limit (times) | Sliding limit (times) |
| --- | --- | --- | --- | --- |
| NO26 | 0.06 | 0 | 54 | 611 |
| AN05 | 0.08 | 8.4 | 62 | 587 |
| AN21 | 0.12 | 15.8 | 150 | 673 |
| AN25 | 0.21 | 38.3 | 198 | 627 |
| AN50 | 0.24 | 43.5 | 93 | 300 |

In accordance with the above described testing, the friction coefficients under lubricating condition are less than about 0.02. On the contrary, the friction coefficient increases rapidly to a value about 0.2 when the lubricating oil on the sliding surface is exhausted. The value of the friction coefficient is equivalent to the friction coefficient between titanium nitride and the aluminum alloy under no lubricating oil. Farther, when the lubricating oil becomes a deficient condition by exposing the aluminum alloy of the sliding member on account of fracture and wearness etc. of the columnar texture, the friction coefficient increases to about 0.5.

In the Table 1, the lubricating limit was defined as numbers of sliding times before starting of friction coefficient increment on account of the above described effects, and the sliding limit was defined as numbers of sliding times before the friction coefficient exceeds 0.4.

In accordance with the Table 1, the testing sample having a small area fraction of the intervals also has a small lubricating limit because a filled amount of the lubricating oil is small. When both the average diameter of the columnar asperities and the area fraction of the intervals become large, the lubricating limit become small, because a retainable capacity of the sample for the lubricating oil reversely decreases, and the sample becomes apt to cause the deficient condition of the lubricating oil. Besides, the fracture of the columnar texture causes early exposure of the base material of the sliding portion, increasing the friction coefficient on account of metal-metal friction, and consequently, lowering values of the sliding limit.

As Table 1 shows, the testing samples AN21 and AN25 among the testing samples of titanium nitrides, AN10, AN21 AN25 in the present embodiment obtained preferable results under the sliding condition equivalent to the reciprocative linear motion sliding test using spindle oil, and it has been revealed that the sliding member related to the present invention has preferable wear resistivity and lubricating property.

In a case when the base member is composed of a soft material, the decrement of the intervals in the columnar texture by deformation of the sliding member under sliding condition can be suppressed by forming the substrate 4 with hard materials. Additionally, the formation of the substrate is effective for improving a bonding force between the columnar texture and the sliding member, but, the substrate can be omitted depending on the sliding condition.

The filling amount of the lubricating agent is proportional to the depth of the intervals, but when the interval is too deep, fracture of the columnar texture is facilitated during sliding. Accordingly, the depth of the interval is preferably at most 5 $\mu$m. On the other hand, when the depth of the interval is too shallow, retention of the lubricating agent becomes difficult. Accordingly, the depth of the interval is preferably at least 0.1 $\mu$m.

(Embodiment 2)

A sliding member was manufactured by irradiating the surface of an aluminum alloy (Si: 11%) plate having dimensions of 50 mm×50 mm×3 mm thick with oxygen ions having an energy of 10 keV concurrently with titanium vapour deposition in a vacuum so as to form a titanium oxide substrate of about 1 $\mu$m thick. Subsequently, a hard columnar texture was formed by irradiating the substrate with oxygen ions mixed with 20% argon ions having an energy of 10 keV concurrently with depositing titanium at a thickness increasing rate of 0.5 nm/sec so as to grow columnar asperities of titanium oxide to about 3 $\mu$m. Besides, the sliding member was cooled by a water cooling device of the holder.

Figure 5:
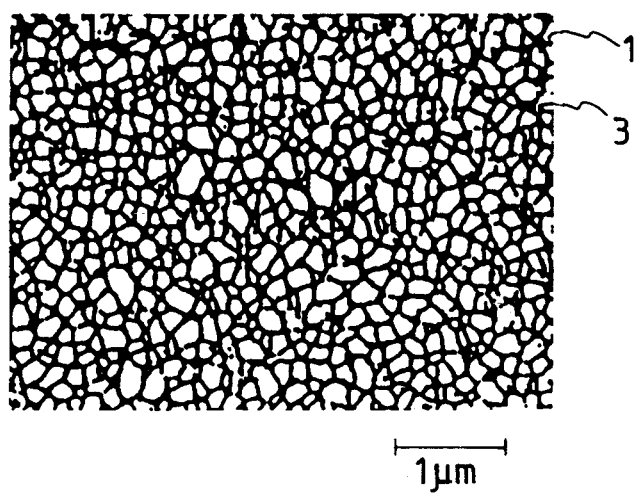
FIG. 5 is an illustration of a scanning electron microscopic photograph of the sliding member surface in the embodiment 2.

FIG. 5 is a schematic illustration of a scanning electron microscopic photograph of a surface of the sliding member in the present embodiment.

Almost the same results were obtained by using krypton or xenon to an inert gas ion beam for irradiation, and an ion beam having a large spattering effect can be used instead of the argon ion beam.

(Embodiment 3)

Hard columnar texture was formed by irradiating an aluminum alloy plate, which was used as the sliding member in the embodiment 2, with an argon ion beam at least 0.4 mA/cm having an energy of 20 keV concurrently with depositing chromium in a vacuum at a thickness increasing rate of 1.0 nm/sec so as to grow columnar asperities of chromium to about 3 $\mu$m. Besides, the sliding member was cooled by a water cooling device of the holder.

(Embodiment 4)

Hard columnar texture was formed by irradiating an aluminum alloy plate, which was used in the above embodiment 3, with an argon ion beam at least 0.5 mA/cm having an energy of 10 keV concurrently with depositing metallic silicon in vacuum at a thickness increasing rate of 0.7 nm/sec so as to grow columnar asperities of silicon to about 5 $\mu$m.

(Embodiment 5)

A solid lubricant was filled into the columnar texture of the sliding members having the columnar texture obtained by the embodiments 1-4. As for the solid lubricants, molybdenum disulfide, acrylic resin low polymer, tetrafluoroethylene resin, zinc, and silver were respectively filled, and, subsequently, cross sections of the columnar texture were observed by a scanning electron microscope in order to investigate filling conditions of the solid lubricants.

Molybdenum disulfide was filled by an application method and a spattering deposition method, respectively. Although only about 70% of the depth of the intervals in the columnar texture was filled by the above methods, the intervals were filled with molybdenum disulfide to 100% of the depth after the end of a sliding test in dry air, and lubricating characteristics were preferable. Acrylic resin low polymer and tetrafluoroethylene resin, which were respectively filled by an immersion method wherein the above resins were ionized as chloride ions and electromagnetically filled into the intervals, to 100% fill the intervals from the bottom of the intervals, and were found to have preferable lubricating characteristics in a sliding test in dry air without splitting of the columnar texture. Titanium nitride having the columnar texture filled respectively with zinc and silver by a plating method increased the friction coefficient to 0.4 in comparison with 0.2 for the friction coefficient of titanium nitride without filling the lubricants in a sliding test in dry air. But, the titanium nitride filled with the lubricants revealed preferable friction characteristics in a sliding test in vacuum. Because the sliding members having columnar texture of titanium oxide obtained in the embodiment 2 were not electroconductive, the solid lubricants could not be filled.

(Embodiment 6)

Bearing sliding tests were performed on shafts, all of which respectively had equivalent columnar texture to the embodiment 1 on their surface, of 20 mm in diameter made from respectively alloy steel, alumina ceramics, mixed ceramics of oxides and nitrides of silicon and aluminum, titanium alloy, and aluminum alloy. Using an apparatus shown in FIG. 8, the columnar texture of titanium oxide was formed at an external surface of sliding a portion of the shaft while rotating the shaft by a holder. On the other hand, as a bearing for the shaft, a slide bearing made from bearing steel of 25 mm in width was used.

Seizing life (hours) of the above described shaft to the bearing was determined under a condition of an eccentric load 10 kgf, and 1000 rpm without any oil supply after a sufficient amount of naphthene group lubricating oil was supplied before the sliding test.

The seizing life of the shafts was extended more than three times by forming the columnar texture in the present embodiments.

(Embodiment 7)

Figure 6:
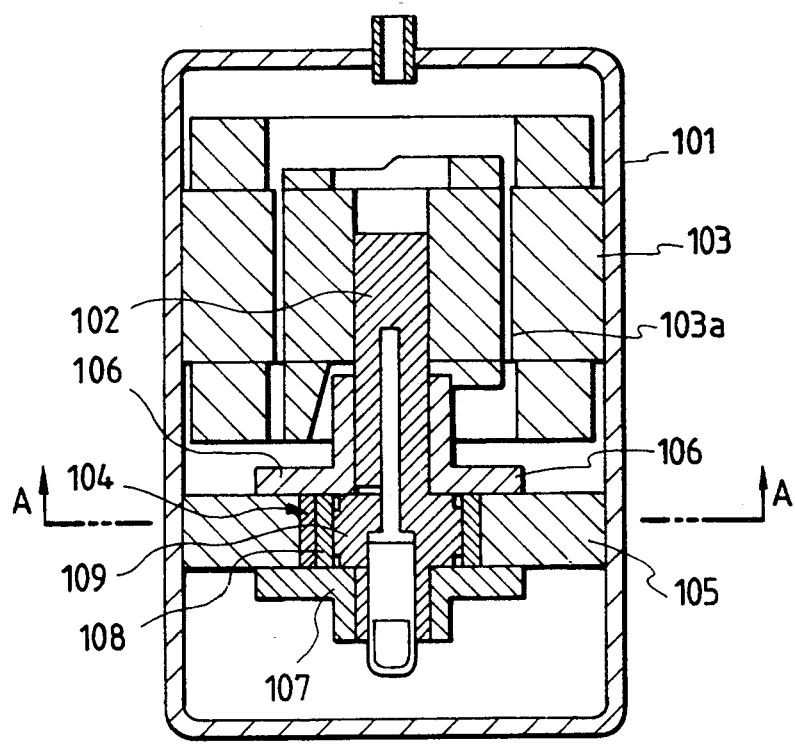
FIG. 6 is a vertical cross section of a rotary compressor.
Figure 7:
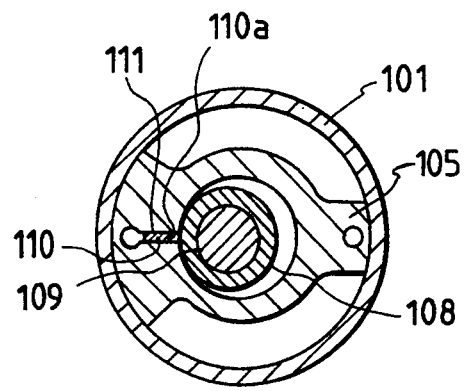
FIG. 7 is a cross section taken along line A—A of FIG. 6.

FIG. 6 is a vertical cross section of a rotary compressor using mainly for refrigerators, and air conditioners etc. FIG. 7 is a horizontal cross section of the rotary compressor (taken along the line A—A of FIG. 6).

The rotary compressor has a structure wherein the crank shaft 102 is supported by journal bearings including an upper bearing 106 and a lower bearing 107, and the crank pin portion 109 of the crank shaft supplies an eccentric rotation to the roller 108 by sliding motion of the journal bearings. The vane groove 111 and the top portion 110a of the vane 110 which are formed on the cylinder 105 for containing the roller 108 are respectively contacted to the external circumference of the roller 108 in a slidable manner so that the vane 111 can slide as a thrust bearing in a direction or a reciprocatory manner.

A field test was performed on ten testing machines wherein the same columnar texture as the test piece AN21 in the embodiment 1 was formed on surfaces of the sliding portions of the crank shaft 102 and the vane 110 of the compressor. An observation of the sliding portions after one year of operation of the testing machines revealed that all sliding portions of the ten testing machines had preferable appearance without showing any traces of seizure which were observed on shafts not treated by the method of the present invention. Accordingly, compressors for freezers having preferable durability can be provided by applying the sliding members of the present invention to the compressor.

(Embodiment 8)

Figure 8:
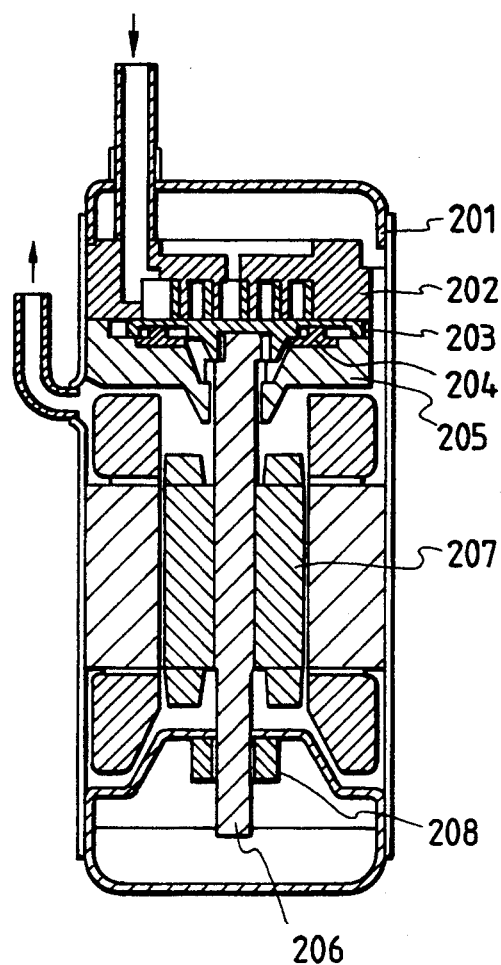
FIG. 8 is a vertical cross section of a sealed scroll compressor.

FIG. 8 is a vertical cross section of a scroll compressor used mainly for an air conditioner etc.

A compressing portion of the compressor is composed of the stationary groove 202 formed in a scroll shape, the movable groove 203 formed in the same scroll shape, the crank shaft 206, and the detente 204. The crank shaft 206 is supported by journal bearings of the upper bearing 205 and the lower bearing 208, and the crank shaft 206 rotates so as to supply an eccentric moving to the movable groove 203. Rotary motion of the movable groove 203 to the stationary groove 202 is restricted by the detente 204, and, accordingly, a space formed between the movable groove 203 and the stationary groove 202 moves, and concurrently a volume of the space shrinks so as to compress a cooling medium gas.

A field test was performed on ten testing machines wherein the same columnar texture as the test pieces in the embodiments 1 and 2 was formed on surfaces of the sliding portions of the crank shaft 206 and the detente 204. An observation of the sliding portions after one year of operation of the testing machines revealed that all sliding portions of the ten testing machines had preferable appearance without showing any traces of seizure which were observed on shafts not being treated by the method of the present invention. Accordingly, compressors for freezers having preferable durability can be provided by applying the sliding members of the present invention to the compressors.

Furthermore, a columnar texture equivalent to that in the embodiment 1 was formed on the surface of the movable groove 203 of the compressor. Rotating torque transmitted to the crankshaft was reduced, and durability of the compressor increased.

The columnar texture formed on the surface of sliding members relating to the present invention facilitates filling and holding of gaseous, liquid, or solid lubricating materials, improves sliding planes in wear resistivity and seizure resistance, and decreases friction forces at sliding portions.

Furthermore, magnetic recording media and compressors etc. using sliding members of the present invention decrease friction forces at sliding portions, and more than double the durable life of the above described apparatus caused by wearness and seizure.

What is claimed is;

1. A sliding member having a columnar texture composed from at least one of metal nitrides, metal oxides, metal carbides, and metals at least on a surface of a sliding portion of a base member, wherein
said columnar texture is composed of an assembly of fine columnar asperities,
intervals formed among said columnar asperities are connected to each other and are composed to be a mesh structure, and
gas/air or a lubricant is retained among the intervals.

2. A sliding member having a columnar texture composed from at least one of metal nitrides, metal oxides, metal carbides, and metals at least on a surface of a sliding portion of a base member, wherein
said columnar texture is composed of an assembly of fine columnar asperities,
intervals formed among said columnar asperities are connected to each other and are composed to be a mesh structure,
a projected area of the mesh structure intervals at the surface of said columnar texture occupies 10–40% of total surface area of said columnar texture, and
gas/air or a lubricant is retained among the intervals.

3. A sliding member having a columnar texture composed from at least one of metal nitrides, metal oxides, metal carbides, and metals at least on a surface of a sliding portion of a base member, wherein
said columnar texture is composed of an assembly of fine columnar asperities,
intervals formed among said columnar asperities are connected to each other and are composed to be a mesh structure,
a depth of said mesh structure interval is 0.1–5 $\mu$m, and
gas/air or a lubricant is retained among the intervals.

4. A sliding member as claimed in any of claims 1, 2, or 3, wherein said columnar texture is composed of an assembly of columnar asperities having 0.1–3 $\mu$m in an average diameter.

5. A sliding member as claimed in any of claims 1, 2 or 3 wherein a basic layer which is composed from at least one of metal nitrides, metal oxides, metal carbides, and metals exists between said columnar texture and the base member.

6. A sliding member as claimed in any of claims 1, 2 or 3 wherein the lubricant is either of liquid lubricants or solid lubricants.

7. A method for manufacturing a sliding member comprising: forming a columnar texture composed of an assembly of fine columnar asperities of metals or metallic compounds by irradiating at least a surface of a sliding portion of a base member with an inactive gas ion beam having directivity while the metals or the metallic compounds are simultaneously being piled up on the surface of the sliding portion of the base member by a vapor deposition method, intervals remaining among said columnar asperities, said intervals being connected to each other to form a mesh structure for retaining lubricant.

8. A method for manufacturing a sliding member comprising:
forming a columnar texture composed from at least one of metal nitrides, metal oxides, and metal carbides by irradiating at least a surface of a sliding portion of a base member with an ion beam having directivity generated by a mixed gas of oxygen, nitrogen, or carbon, with an inert gas while metals or metallic compounds are simultaneously being piled up on the surface of the sliding portion of the base member by a vapor deposition method, intervals remaining among said columnar asperities, said intervals being connected to each other to form a mesh structure for retaining lubricant.

9. A method for manufacturing a sliding member as claimed in any of claims 7 or 8, wherein the columnar texture is composed of an assembly of columnar asperities formed and piled on the surface of the sliding portion of the base by a physical vapour deposition method in vacuum under 0.005 Torr.

10. A method for manufacturing a sliding member as claimed in any of claims 7 or 8, wherein said inert gas is at least one of argon, xenon, or krypton gas.

11. A method for manufacturing a sliding member as claimed in any of claims 7 or 8, wherein said sliding member is irradiated by said inert gas ion beam having an energy between 500 eV and 200 keV at a temperature between room temperature and a thermal treating temperature of said sliding member.

12. A compressor for a freezer or an air conditioner cooling a heat exchanger by compressing and expanding a cooling gas, comprising:

a sliding member used at least at a bearing portion of the compressor, said sliding member having a columnar texture composed from at least one of metal nitrides, metal oxides, metal carbides, and metals at a surface of a sliding portion, said columnar texture is composed of an assembly of fine columnar asperities, intervals among said columnar asperities are connected to each other to form a mesh structure, and said intervals retain a liquid or solid lubricant.

13. A compressor for a freezer or an air conditioner as claimed in claim 12, wherein said sliding member is made from an aluminum alloy containing 1–45% by weight of Si, 0.1–20% by weight of elements in IIIa group, 0.1–5% by weight of at least one of elements of IVa group and Va group, and the balance is substantially Al.

* * * * *